Figure 1:
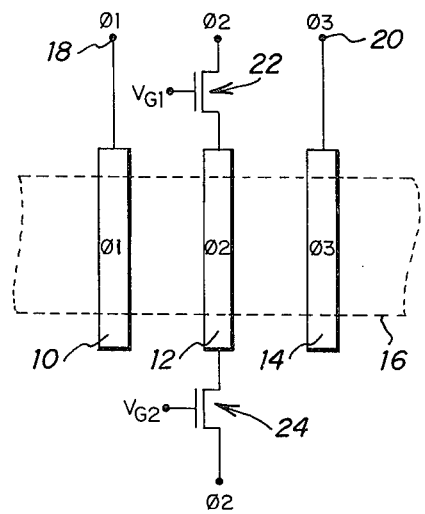

United States Patent [19]
Emmons

[11] 3,947,705
[45] Mar. 30, 1976

[54] METHOD AND SYSTEM FOR ACHIEVING AND SAMPLING PROGRAMMABLE TAP WEIGHTS IN CHARGE COUPLED DEVICES

[75] Inventor: Stephen Perry Emmons, Dallas, Tex.
[73] Assignee: Texas Instruments Inc., Dallas, Tex.
[22] Filed: Oct. 24, 1974
[21] Appl. No.: 517,565

[52] U.S. Cl. ............ 307/304; 307/221 D; 307/251; 357/24
[51] Int. Cl.² H03K 5/18; H01L 27/00; H01L 31/00; G11C 19/00
[58] Field of Search ............ 307/221 C, 221 D, 304, 307/251; 357/24

[56] References Cited
UNITED STATES PATENTS

| | | | |
|---|---|---|---|
| 3,623,132 | 11/1971 | Green | 357/24 X |
| 3,858,232 | 12/1974 | Boyle et al. | 356/24 |
| 3,868,516 | 2/1975 | Buss | 307/221 D X |
| 3,877,056 | 4/1975 | Bailey | 307/221 D X |

*Primary Examiner*—John S. Heyman
*Assistant Examiner*—Larry N. Anagnos
*Attorney, Agent, or Firm*—Hal Levine; James T. Comfort; Richard L. Donaldson

[57] ABSTRACT

The specification discloses a circuit for sampling charge stored adjacent a phase electrode in a charge coupled device and for selectively weighting the sampled charge. The circuit includes a first insulated gate field effect transistor connected at its source to one end of the phase electrode and connected at its drain to receive a clock. A predetermined first voltage is applied to the gate of the first transistor. A second insulated gate field effect transistor is connected to the other end of the phase electrode and is connected at its drain to receive a clock. A preselected second voltage is applied to the gate of the second transistor in order to control the percentage of charging current applied to the phase electrode through the second transistor. The preselected second voltage is equal to or less than the predetermined first voltage in order to maintain the clock voltage of the phase electrode at a predetermined set value. The amount of charging current applied to the phase electrode through each of the first and second transistors is detected in order to provide a weighted indication of the charge stored adjacent the phase electrode. The weighting applied to the sampled charge may be varied by varying the preselected second voltage.

15 Claims, 2 Drawing Figures

METHOD AND SYSTEM FOR ACHIEVING AND SAMPLING PROGRAMMABLE TAP WEIGHTS IN CHARGE COUPLED DEVICES

The present invention relates to charge transfer devices, and more particularly relates to programmable tap weights in charge transfer devices.

Semiconductor charge transfer devices, including charge coupled devices (CCDs) and bucket brigades (BBs) are well known and have been used in a large number of signal processing applications including shift registers, filters and the like. When charge transfer devices are used in transversal or matched filters, for example, samples of bits stored in the devices are taken at "taps" or phase electrodes. These samples are conventionally weighted and then combined to provide the desired filter function.

Various techniques have been heretofore proposed for sampling the charges stored in charge transfer devices and for weighting the sampled charges. For example, it has heretofore been proposed to weight stages of a CCD matched filter by splitting or dividing phase electrodes into two portions, the relative area ratios of the electrodes defining the desired weighting. Such split electrode devices are described in patent application Ser. No. 320,382, filed Jan. 2, 1973 (U.S. Pat. No. 3,877,056 issued Apr. 8, 1975), by Walter H. Bailey and entitled "Charge Transfer Device Signal Processing System", and assigned to the present assignee. However, this technique increases the fabrication complexity of the device, and is not adaptable to changing of the desired weighting. A need has thus arisen for a technique for allowing selective programming of the weighting of sampled stages of a charge transfer device. Such a technique should not only enable a relatively wide range of weighting change, but should also enable nondestructive sampling of the charge stored under selected phase electrodes.

In accordance with the present invention, a charge transfer device includes phase electrodes which receive clock voltage from a first circuit. A second circuit is provided to supply variable clock current to the electrodes in order to selectively weight the total charging current of the electrodes.

In accordance with another aspect of the invention, a circuit is provided for selectively weighting stages of a charge coupled device having a plurality of phase electrodes. A first insulated gate field effect transistor is connected at its source to one end of one of the phase electrodes and is connected at its drain to receive clocks. Circuitry applies a predetermined first voltage to the gate of the first transistor to provide a desired clock voltage on the phase electrode. A second insulated gate field effect transistor is connected to the other end of the phase electrode and is connected at its drain to receive a clock. Circuitry applies a preselected second voltage to the gate of the second transistor in order to control the percentage of charging current applied to the phase electrode through the second transistor. Circuitry detects the amount of charging current applied to the phase electrode in order to indicate the charge stored adjacent the phase electrode.

In accordance with a more specific aspect of the invention, a circuit is provided for sampling charge stored adjacent a phase electrode in a charge coupled device and for selectively weighting the sampled charge. A first insulated gate field effect transistor is connected at its source to one end of the phase electrode. A predetermined voltage is applied to the gate of the first transistor. A first switch is operable during a first clock period to store a reference voltage on a first capacitor and to discharge the phase electrode to circuit ground. The first switch is operable during a second clock period to couple the first capacitor to the drain of the first transistor to apply charging current to the phase electrode. A second insulated gate field effect transistor is connected at its source to a second end of the phase electrode. A variable bias voltage is applied to the gate of the second transistor to program the desired weighting of the sampled charge. A second switch is operable during the first clock period to store a reference voltage on a second capacitor. A second switch is operable during the second clock period to couple the second capacitor to the drain of the second transistor to apply a charging current to the phase electrode. The magnitude of the charging current supplied by the second transistor is determined by the variable bias voltage. Circuitry is provided to sense the decrease in voltage on the first and second capacitors after the second clock period for generating a signal representative of the sampled weighted charge adjacent the phase electrodes.

In accordance with yet another aspect of the invention, a method of sampling and weighting charge stored adjacent a phase electrode of a charge coupled device includes applying a first clock signal to the drain of a first insulated gate field effect transistor connected at its source to one end of the phase electrode. A predetermined bias voltage is applied to the gate of the first transistor. A second clock signal is applied to the drain of a second insulated gate field effect transistor connected at its source to a second end of the phase electrode. A variable bias voltage is applied to the gate of the second transistor in order to control the amount of charging current applied to the phase electrode through the second transistor. The amounts of charging current which is applied to the phase electrode by each of the first and second transistors are detected in order to generate weighted samples of the charge stored adjacent the phase electrode.

Figure 2:
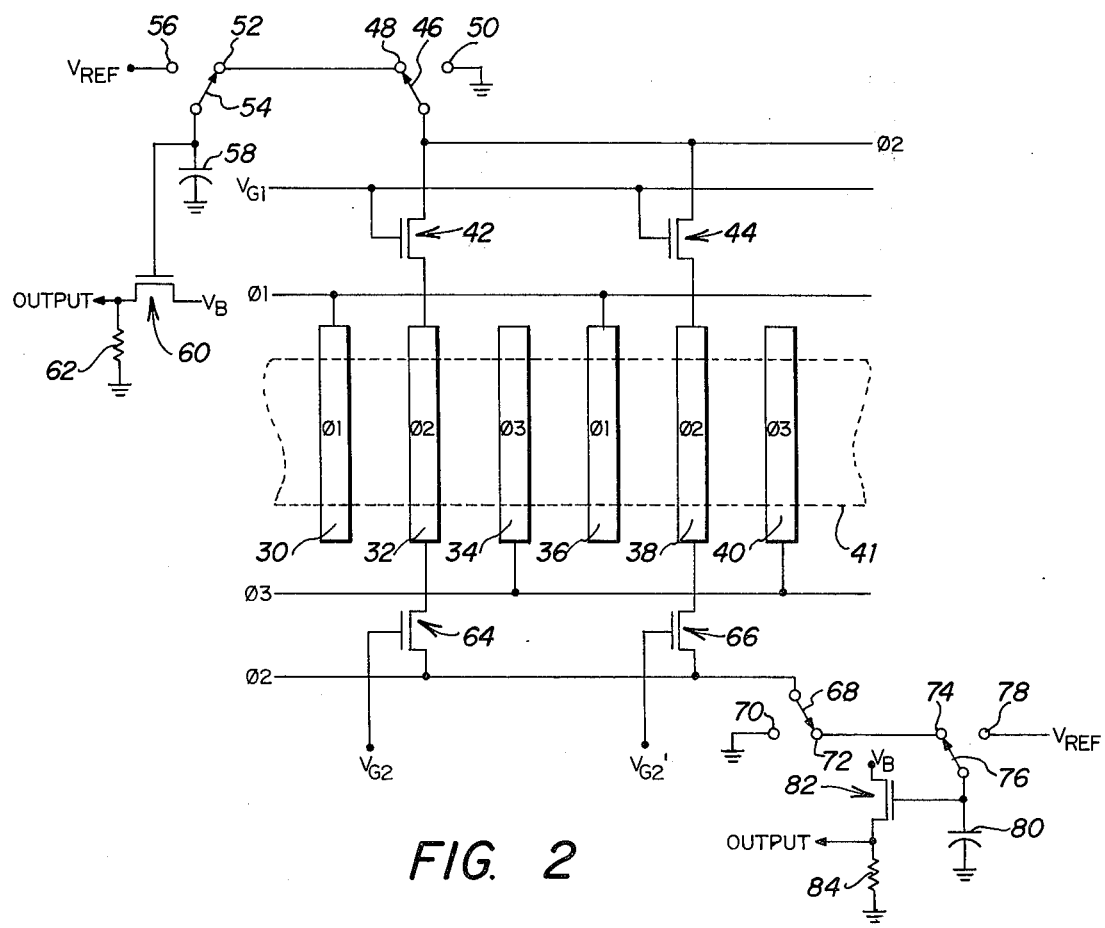

For a more complete understanding of the present invention and for further objects and advantages thereof, reference is now made to the following description, taken in conjunction with the accompanying drawings, in which:

FIG. 1 is a schematic diagram of a circuit embodying the basic concept of the present invention; and FIG. 2 is a schematic diagram of a circuit for sampling and weighting charges stored in a charge coupled device.

Referring to FIG. 1, a portion of a typical charge coupled device (CCD) is illustrated. The CCD is comprised of a plurality of phase electrodes 10, 12 and 14 which span a channel 16 in the conventional manner. As is well known, the CCD stores charge in potential wells or packets, and moves the charge packets from one phase or clock electrode to another in order to function as a shift register. The CCD includes a semiconductor substrate which is typically formed of P-type silicon, along with a relatively thin insulating layer which may be comprised of silicon oxide. The electrodes 10–14 comprise only a portion of an array of similar sets of electrodes disposed along the length of the channel 16.

In the conventional CCD, clock or phase signals are sequentially applied to the electrodes in order to control the movement of the charge packets along the channel. The clock signals charge the phase electrodes to a predetermined clock voltage, the charging currents depending on the magnitudes of signal charges stored at the storage sites adjacent the respective electrodes. Thus, in a three phase conventional CCD, three phase signals are sequentially applied to sets of the electrodes. Electrodes 10 and 14 are operated in the conventional manner and receive, respectively, phase one and phase three clock signals which are applied via terminals 18 and 20.

It is assumed that it is desired to selectively weight the operation of the phase two electrode 12 in the CCD shown in FIG. 1. Weighting according to the present invention is accomplished with the use of insulated gate field effect transistors 22 and 24, commonly termed MOSFETs. MOSFET 22 is connected at its source to electrode 12 and is adapted to receive at its drain a clocking signal in phase with the clocking voltage that would normally be applied to phase two, but the clocking signal at all on times being of substantially higher amplitude than such normally applied phase two clocking voltage. A second MOSFET 24 is connected at its source to electrode 12 and is adapted to receive at its drain the same clocking signal. A bias voltage $V_{G1}$ is applied to the gate of MOSFET 22, $V_{G1}$ being equal to the desired amplitude of the phase two clock voltage plus the threshold of the transistor. An adjustable bias voltage $V_{G2}$, which is less than or equal to $V_{G1}$, is applied to the gate of the MOSFET 24.

An important aspect of the present invention is that the charging current required to raise the potential of the electrode 12, which charging current depends on the magnitude of signal charge stored beneath that electrode, may be split between the two MOSFETs 22 and 24, and that the percentage of the charge being applied to the electrode 12 from the MOSFET 24 may be adjusted from zero to 50% of the total charge, by changing the potential $V_{G2}$ applied to the gate of the MOSFET 24. Another important aspect of the invention is that if the voltage $V_{G2}$ is never allowed to exceed voltage $V_{G1}$, then the clocking potential applied to the electrode 12 is determined by $V_{G1}$ and is not altered, although an adjustable percentage of the charging current may thus be supplied by the MOSFET 24. Since the total charging current to the electrode 12 is dependent on the magnitude of the signal charge stored beneath that electrode, the charging current supplied respectively by MOSFETs 22 and 24 represent weighted values or analogs of the stored signal and may be integrated to provide weighted output signals, thus achieving non-destructive sampling and weighting of the signals stored beneath the electrode 12. The present structure thus enables programmable CCD weighting to be accomplished.

FIG. 2 illustrates a circuit embodying the programmable weight technique of the invention, and which also enables non-destructive sampling of the charge stored beneath the phase two electrodes.

The sampling circuitry illustrated in FIG. 2 is disclosed in greater detail in the copending patent application Ser. No. 517,566 entitled "Method and System for Sensing Charges at Distributed Points on a Charge Coupled Device", filed Oct. 24, 1974 by the present inventor and assigned to the present assignee. As described in the copending patent application, the sampling circuitry enables the use of relatively small storage capacitors having a capacitance in the range of the capacitance of the phase electrodes. The mechanical switches illustrated in FIG. 2 are provided for purposes of illustration only, and it is understood that the switches will normally be replaced by suitable electronic switching devices in a practical circuit environment. For example, the mechanical switches illustrated in FIG. 2 could be replaced with the use of insulated gate field effect transistors which are operable in response to suitable clocking signals conventionally derived.

Referring to FIG. 2, a plurality of phase electrodes 30–40 span a CCD channel 41 in the conventional manner. The CCD illustrated is a three phase device, although it will be understood that other phase CCDs can be utilized in accordance with the present invention.

Phase one clock signals are applied to electrodes 30 and 36 and phase three clock signals are applied to electrodes 34 and 40 in the conventional manner. In the present embodiment, it is assumed that it is desirable to sense the charge stored beneath electrodes 32 and 38 and to selectively weight the sampled charge. Insulated gate field effect transistors or MOSFETs 42 and 44 are connected at their sources to electrodes 32 and 38 and are connected at their drains to receive a clocking signal in phase with the phase two clocking voltage that would normally be applied to phase two, but the clocking signal at all on times being of substantially higher amplitude than such normally applied phase two clocking voltage. The gates of MOSFETs 42 and 44 are interconnected to receive the bias signals $V_{G1}$, $V_{G1}$ being equal to the desired amplitude of the phase two clock voltage plus the threshold voltage of the transistor.

A switch arm 46 is connected with the drain of the MOSFETs 42 and 44 and is movable between contacts 48 and 50. Contact 50 is connected to circuit ground, while contact 48 is connected to a switch contact 52. A switch arm 54 is movable between contact 52 and contact 56. Contact 56 is connected to a source of reference voltage $V_{ref}$. The switch arm 54 is connected to a storage capacitor 58 which may be provided with a capacitance equal to or slightly above the combined capacitance of the electrodes 32 and 38 and their associated clock lines. A MOSFET 60 is connected in a source follower configuration with the capacitor 58. The gate of the MOSFET 60 is connected to a terminal of the capacitor 58, while a reference voltage $V_B$ is applied to the drain of the MOSFET 60. The source of the MOSFET 60 is connected to circuit ground through a load resistance 62 in order to provide an output signal which is representative of a percentage of the weighted sampled charge beneath electrodes 32 and 38.

In a similar manner, MOSFETs 64 and 66 are connected at their sources to the opposite ends of electrodes 32 and 38 and are connected at their drains to receive the phase two clock signal. The gates of MOSFETS 64 and 66 receive variable voltages $V_{G2}$ and $V_{G2'}$ which are utilized to control the amount of charging current applied to the electrodes through the MOSFETs 64 and 66. The drains of the MOSFETs 64 and 66 are applied to a switch arm 68 which is movable between the switch contacts 70 and 72. Contact 70 is connected to circuit ground, while contact 72 is connected to a switch contact 74. A switch arm 76 is movable between contacts 74 and a contact 78. Contact 78 is connected to the source of reference voltage $V_{ref}$. The switch arm 76 is connected to a capacitor 80 having the same capacitance as capacitor 58. A source follower connected MOSFET 82 is connected at its gate to capacitor 80 and is provided with a source of bias voltage $V_B$. MOSFET 82 is connected to circuit ground through a load resistance 84 in order to provide an output signal representative of a percentage of the charging circuit applied through MOSFET 64 and 66 to the electrodes 32 and 38.

In the operation of the circuit shown in FIG. 2, during a first clock period, the switch arms 54 and 76 are connected respectively to contacts 56 and 78 such that the capacitors 58 and 80 are charged up to the reference voltage $V_{ref}$. Also during the first clock period, the switch arms 46 and 68 are connected to contacts 50 and 70, respectively, in order that the electrodes 32 and 38 are discharged to circuit ground via transistors 42, 44, 64 and 66.

During a second clock period, the timing of which is determined by the overall timing of the CCD device and which corresponds to the normal on time of the phase electrode two, the switch arms 46 and 54 are moved to the illustrated position such that the voltage across capacitor 58 is applied through the MOSFETs 42 and 44 to the electrodes 32 and 38. Simultaneously, the switch arms 68 and 76 are moved to the illustrated positions such that the voltage stored on capacitor 80 is applied through the MOSFETs 64 and 66 to the electrodes 32 and 38. The electrodes 32 and 38 are thus provided with a predetermined voltage equal to $V_{G1}$ minus the threshold voltage and charging currents which are dictated by the gate voltages $V_{G1}$, $V_{G2}$ and $V_{G2'}$ and the magnitudes of the signal charges present at the electrode sites. Due to the driving of the electrodes 32 and 38, the storage voltages across the capacitors 58 and 80 decrease. The decreases in voltages across the capacitors cause changes in the gate biases of the source follower MOSFETs 60 and 82, thereby resulting in decreases in the output signals provided by the sources of the MOSFETs 60 and 82. These output signals provide weighted indications of the amount of signal charge stored underneath the electrodes 32 and 38, and may be combined by suitable circuitry to provide the desired filter function.

An important aspect of the invention is that the percentage of the total charging current supplied by each of the MOSFETs 64 and 66 to the electrodes 32 and 38 respectively may be selectively controlled by control of the voltages $V_{G2}$ and $V_{G2'}$, while the clocking voltage applied to the electrodes 32 and 38 may be maintained at a desired stable level equal to $V_{G1}$ minus the transistor threshold. Specifically, the percent of the total charging current being supplied by MOSFETs 64 and 66 may be adjusted from zero to 50% by changing the voltages $V_{G2}$ and $V_{G2'}$. If the voltages $V_{G2}$ and $V_{G2'}$ are not allowed to exceed the voltage $V_{G1}$ applied to MOSFETs 42 and 44, then the overall potential applied to the phase electrodes 32 and 38 is not altered and may be maintained at a desired level.

As an example of the operation of the present system, it will be assumed that it is desirable to provide a clock voltage to electrodes 32 and 38 at a level of 15 volts. The voltages $V_{G1}$, $V_{G2}$ and $V_{G2'}$ are sufficiently less than the voltage $V_{ref}$ applied to the capacitor that under maximum charge conditions, the voltages on capacitors 58 and 80 never drop below $V_{G1}$. For example, to provide a clocking voltage of 15 volts, the voltage $V_{G1}$ may comprise 15 volts plus the transistor threshold, while the voltage $V_{ref}$ might comprise 35 volts. The voltages $V_{G2}$ and $V_{G2'}$ could be varied from 0 to 15 volts.

If the voltages $V_{G2}$ and $V_{G2'}$ appled to the gates of the MOSFETs 64 and 66 are set at 0 volts, the MOSFETs 64 and 66 are cut off and all the charging current to the electrodes 32 and 38 is applied by MOSFETs 42 and 44 respectively. As voltages $V_{G2}$ and $V_{G2'}$ are increased, the amount of current supplied by the MOSFETs 64 and 66 increases, accompanied by corresponding decreases in the charging current supplied by the MOSFETs 42 and 44, respectively. However, as long as the voltage $V_{G2}$ and $V_{G2'}$ are maintained equal to or less than the voltage $V_{G1}$, the voltage applied to electrodes 32 and 38 is not varied.

This technique thus enables a wide range of programming of the weighting of CCD taps, and provides the functions of the "split electrode" weighting techniques without the fabrication complexities and inflexibility introduced thereby.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. In a charge transfer device having electrically continuous phase electrodes disposed at charge storage sites of said device and wherein said electrodes are selectively connected to voltage sources for supplying current to charge said electrodes to a predetermined voltage for transfer of signal charge from one storage site to another, the charging current supplied to a particular electrode depending on the magnitude of the signal charge stored at that storage site, for at least one of said phase electrodes:

first and second circuit means for supplying separate first and second charging currents for charging said electrode to said predetermined voltage, and means for selectively adjusting the charging current supplied by at least one of said first and second circuit means such that said charging current supplied by said first and second means represent respective weighted values of the signal charge stored at the storage site of said one phase electrode, and means for integrating at least one of said first and second charging currents to produce an output signal that is a weighted sample of said stored signal charge.

2. The combination of claim 1, wherein said first circuit means comprises a first insulated gate field effect transistor having a gate connected to a fixed voltage source such that the gate voltage of said first transistor determines said predetermined voltage, and wherein said second circuit means comprises a second integrated gate field effect transistor having its gate connected to receive a voltage adjustable to a value not greater than the gate voltage of said first transistor for adjusting the charging current supplied by said second transistor to a desired percentage of the total charging current supplied by said first and second transistors.

3. A circuit for selectively detecting and weighting signals stored at selected charge storage sites of a charge coupled device shift register having electrically continuous phase electrodes located adjacent charge storage sites including said selected charge storage sites of said shift register, wherein transfer of signal charge from one charge storage site to an adjacent site is effected by selective connection of said electrodes to clocked phase voltage sources for supplying current to charge said electrodes to a predetermined voltage, the charging current supplied to a particular electrode depending on the magnitude of signal charge stored at the charge storage site adjacent said electrode, said selective detecting and weighting circuit comprising:

first and second supply voltage lines; for each electrode adjacent one of said selected charged storage sites circuit means for controlling supply of charging current for charging said electrode to said predetermined voltage, said circuit means including a first insulated gate field effect transistor having a channel connected between said phase electrode and said first supply voltage line; means for applying a predetermined first gate voltage to the gate of said first transistor to provide a desired clock voltage to said one phase electrode to supply through said first transistor charging current to said electrode; a second insulated gate field effect transistor having a channel connected between said one phase electrode and said second supply voltage line; means for applying an individually adjustable preselected second voltage not greater than said first gate voltage to the gate of said second transistor to control the percentage of charging current applied to said one phase electrode through said second transistor; and means common to all of said selected phase electrodes for detecting and integrating the charging currents applied to said phase electrodes by at least one of said first and second transistors in order to provide a weighted analog of the total signal charge stored adjacent said selected phase electrodes.

4. A circuit according to claim 3, wherein said first supply voltage line and said second supply voltage line are clocked during a predetermined phase associated with said selected electrodes.

5. A circuit according to claim 4, wherein said detecting and integrating means include a capacitor selectively connectable during said predetermined phase to one of said first and second supply lines and means for precharging said capacitor to a reference voltage; and circuit means for detecting the voltage level stored on said capacitor.

6. A circuit according to claim 5, wherein said means for detecting the voltage level stored on said capacitor is a source follower amplifier.

7. A circuit according to claim 5, wherein said detecting and integrating means further includes a second capacitor selectively connectable during said predetermined phase to the other one of said first and second supply lines and means for precharging said second capacitor to a reference voltage; and second circuit means for detecting the voltage level stored on said second capacitor.

8. A circuit according to claim 7, wherein said second circuit means for detecting the voltage level stored on said second capacitor comprises a source follower amplifier.

9. A circuit for selectively detecting and weighting signals stored at selected charge storage sites of a charge coupled device having electrically continuous phase electrodes located adjacent charge storage sites including said selected sites of said charge coupled device, wherein transfer of signal charge from one charge storage site to an adjacent site is effected by selective connection of said electrodes to clocked phase voltage sources for supplying current to electrodes so connected to charge said electrodes to a predetermined voltage, the charging current supplied to a particular electrode depending on the magnitude of signal charge stored at the charge storage site adjacent said electrode, said circuit comprising:

a first insulated gate field effect transistor connected at its source to said phase electrode;

means for applying a predetermined voltage to the gate of said first transistor;

a first capacitor;

first switch means operable during a first clock period to store a reference voltage on said first capacitor and to discharge said phase electrode to circuit ground;

said first switch means operable during a second clock period to couple said first capacitor to the drain of said first transistor to apply charging current to said phase electrode;

a second insulated gate field effect transistor connected at its source to said phase electrode;

means for applying a variable bias voltage to the gate of said second transistor;

a second capacitor;

second switch means operable during the first clock period to store a reference voltage on said second capacitor;

said second switch means operable during the second clock period to couple said second capacitor to the drain of said second transistor to apply charging current to said phase electrode;

said first and second transistors supplying the total charging current for said phase electrode during said second clock period, said total charging current depending on the magnitude of signal charge stored at the storage site adjacent phase electrode and the proportion of said total charging current supplied by said second transistor being determined by said variable bias voltage; and circuit means for sensing the decrease in voltage on each of said first and second capacitors after said second clock period for generating respective signals representative of weighted samples of said signal charge stored at said charge storage site adjacent said phase electrode.

10. A circuit according to claim 9, including a plurality of said phase electrodes each having individual ones of said first and second insulated gate field effect transistors;

wherein said first switch means and said first capacitor are common to all of said first transistors, and said second switch means and said second capacitor are common to all of said second transistors; and wherein the capacitance of each of said first and second capacitors is in the range of the total capacitance of said plurality of phase electrodes.

11. A circuit according to claim 9, wherein said first and second capacitors are connected to the gates of respective source follower amplifiers.

12. The circuit of claim 9 wherein said first and second switch means comprise insulated gate field effect transistors.

13. The method of sampling and weighting a signal stored in the form of a charge packet adjacent an electrically continuous phase electrode of a charge coupled device comprising:

applying during a selected clock period a first clock to the drain of a first insulated gate field gate transistor connected at its source to said phase electrode;

applying during said selected clock period a predetermined bias voltage to the gate of said first transistor;

applying during said selected clock period a second clock to the drain of a second insulated gate field effect transistor connected at its source to said phase electrode;

applying during said selected clock period an adjustable bias voltage of magnitude less than or equal to said predetermined bias voltage to the gate of said second transistor;

such that said first and second transistors supply to said phase electrode a charging current dependent on the magnitude of said signal charge stored adjacent said electrode, to charge said electrode to a voltage dependent on said predetermined bias voltage, the proportion of said charging current supplied by said second transistor being controlled by said adjustable gate voltage;

and detecting and integrating the amount of charging current supplied by one of said first and second transistors to provide a weighted sample of said signal stored adjacent said phase electrode.

14. A method according to claim 13, including the further step of detecting and integrating the amount of charging current supplied by the other one of said first and second transistors to provide a further weighted sample of said signal stored adjacent said phase electrode.

15. A method according to claim 13, further comprising varying the level of bias voltage applied to the gate of said second transistor to vary the amount of charging current applied to said phase electrode through said second transistor and thereby providing an electronically adjustable weighting factor for said detected sample.

* * * * *